(12) United States Patent
Cao

(10) Patent No.: US 11,665,954 B2
(45) Date of Patent: May 30, 2023

(54) ORGANIC LIGHT EMITTING DIODE DISPLAY DEVICE

(71) Applicant: Wuhan China Star Optoelectronics Semiconductor Display Technology Co., Ltd., Wuhan (CN)

(72) Inventor: Jun Cao, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 675 days.

(21) Appl. No.: 16/631,204

(22) PCT Filed: Jan. 30, 2019

(86) PCT No.: PCT/CN2019/073851
§ 371 (c)(1),
(2) Date: Jan. 15, 2020

(87) PCT Pub. No.: WO2020/077919
PCT Pub. Date: Apr. 23, 2020

(65) Prior Publication Data
US 2021/0226139 A1    Jul. 22, 2021

(30) Foreign Application Priority Data
Oct. 16, 2018  (CN) .......................... 201811200303.2

(51) Int. Cl.
| | | |
|---|---|---|
| H01L 51/50 | (2006.01) |
| H01L 51/00 | (2006.01) |
| C09K 11/54 | (2006.01) |
| C09K 11/59 | (2006.01) |
| C09K 11/64 | (2006.01) |
| C09K 11/65 | (2006.01) |

(52) U.S. Cl.
CPC .......... H01L 51/0097 (2013.01); C09K 11/54 (2013.01); C09K 11/59 (2013.01); C09K 11/641 (2013.01); C09K 11/65 (2013.01); H01L 51/0034 (2013.01); H01L 51/0094 (2013.01); *H01L 2251/5338* (2013.01)

(58) Field of Classification Search
None
See application file for complete search history.

(56) References Cited

U.S. PATENT DOCUMENTS

2019/0074460 A1 *   3/2019   Cai .................... H01L 51/5237

FOREIGN PATENT DOCUMENTS

| CN | 206650080 | 11/2017 |
| CN | 207441754 | 6/2018 |
| CN | 108258146 | 7/2018 |

* cited by examiner

Primary Examiner — Gregory D Clark
(74) *Attorney, Agent, or Firm* — PV IP PC; Wei Te Chung; Zhigang Ma

(57) ABSTRACT

Provided is an organic light emitting diode display device. The organic light emitting diode display device includes a flexible substrate, including a display region, a first barrier region and a second barrier region, wherein the first barrier region is located between the display region and the second barrier region, and a barrier is disposed on the flexible substrate of the second barrier region; wherein a groove is formed in the flexible substrate of the first barrier region, and an organic light emitting diode unit is disposed on the flexible substrate of the display region.

19 Claims, 3 Drawing Sheets

ORGANIC LIGHT EMITTING DIODE DISPLAY DEVICE

RELATED APPLICATIONS

This application is a National Phase of PCT Patent Application No. PCT/PCT/CN2019/073851 having International filing date of Jan. 30, 2019, which claims the benefit of priority of Chinese Patent Application No. 201811200303.2 filed on Oct. 16, 2018. The contents of the above applications are all incorporated by reference as if fully set forth herein in their entirety.

FIELD AND BACKGROUND OF THE INVENTION

The present invention relates to a display technology field, and more particularly to an organic light emitting diode display device.

Organic light-emitting diode (OLED) devices have been widely used due to their self-illumination, fast response, wide viewing angle, high contrast and flexibility. The organic film layer of the illuminating unit in the OLED device is particularly sensitive to external water and oxygen, so more stringent encapsulation conditions are required to protect the device. At present, the method of film encapsulation is adopted. Namely, the device is encapsulated by means of overlapping inorganic/organic/inorganic multilayer films, and the water and oxygen invasion path is prolonged, thereby not only achieving the purpose of blocking water and oxygen, but also realizing the effect of flexible display.

The inorganic layer in the film encapsulation acts to block water and oxygen, and the organic layer is used to cover the particles produced in the front-end process and to relieve the stress generated when the film is bent. However, due to the fluidity of the organic layer, in order to limit the organic layer in a specific region, one or a few turns of the barrier are generally disposed around the periphery of the display area to block the flow of the organic layer.

Generally, the film formation range of the organic layer in the film encapsulation is in the region surrounded by the barrier. Thus, the organic layer will gradually become thinner at the edge (the area near the barrier). The closer to the barrier, the thinner the thickness of the organic layer becomes. When the particle falls in this position during or before the process of forming the organic layer, the organic layer may not be able to completely cover the particle. Consequently, the film layers in the subsequent process are pierced, which reduces the encapsulation effect.

SUMMARY OF THE INVENTION

An objective of the present invention is to provide an organic light emitting diode display device capable of improving the ability of an organic layer to cover the particle and capable of improving the encapsulation effect.

For solving the aforesaid issues, the present invention provides an organic light emitting diode display device, including:

a flexible substrate including a display region, a first barrier region and a second barrier region, wherein the first barrier region is located between the display region and the second barrier region, and a barrier is disposed on the flexible substrate of the second barrier region; wherein a groove is formed in the flexible substrate of the first barrier region, and an organic light emitting diode unit is disposed on the flexible substrate of the display region, and a depth range of the groove is from 1 μm to 10 μm, and a thin film encapsulation layer is disposed on the organic light emitting diode unit and the barrier, and the thin film encapsulation layer includes a stacked structure of a first inorganic layer, a first organic layer and a second inorganic layer, wherein a thickness of the first organic layer near the barrier is greater than a predetermined value.

In the organic light emitting diode display device of the present invention, the groove is formed by etching or imprinting.

In the organic light emitting diode display device of the present invention, the organic light emitting diode display device further includes:

a switching array layer, located on the entire flexible substrate, wherein the switching array layer corresponding to the first barrier region also possesses a groove.

In the organic light emitting diode display device of the present invention, a cross-sectional shape of the groove is curved or trapezoidal.

In the organic light emitting diode display device of the present invention, the organic light emitting diode display device further includes:

the first organic layer covers the display region and the first barrier region, and the first organic layer is located inside the barrier.

In the organic light emitting diode display device of the present invention, a material of the first inorganic layer includes SiNx, SiOxNy, SiOx, SiCxNy, ZnO and AlO.

In the organic light emitting diode display device of the present invention, a material of the first organic layer includes Acrylate, hexamethyldisiloxane (HMDSO), polyacrylates, polycarbonates and polystyrene.

In the organic light emitting diode display device of the present invention, a thickness range of the flexible substrate is from 5 μm to 30 μm.

For solving the aforesaid issues, the present invention provides an organic light emitting diode display device, including:

a flexible substrate including a display region, a first barrier region and a second barrier region, wherein the first barrier region is located between the display region and the second barrier region, and a barrier is disposed on the flexible substrate of the second barrier region; wherein a groove is formed in the flexible substrate of the first barrier region, and an organic light emitting diode unit is disposed on the flexible substrate of the display region.

In the organic light emitting diode display device of the present invention, a depth range of the groove is from 1 μm to 10 μm.

In the organic light emitting diode display device of the present invention, the groove is formed by etching or imprinting.

In the organic light emitting diode display device of the present invention, the organic light emitting diode display device further includes:

a switching array layer, located on the entire flexible substrate, wherein the switching array layer corresponding to the first barrier region also possesses a groove.

In the organic light emitting diode display device of the present invention, a cross-sectional shape of the groove is curved or trapezoidal.

In the organic light emitting diode display device of the present invention, the organic light emitting diode display device further includes:

a thin film encapsulation layer, disposed on the organic light emitting diode unit and the barrier, wherein the thin film encapsulation layer includes a stacked structure of a first inorganic layer, a first organic layer and a second inorganic layer, wherein a thickness of the first organic layer near the barrier is greater than a predetermined value.

In the organic light emitting diode display device of the present invention, the first organic layer covers the display region and the first barrier region, and the first organic layer is located inside the barrier.

In the organic light emitting diode display device of the present invention, a material of the first inorganic layer includes SiNx, SiOxNy, SiOx, SiCxNy, ZnO and AlO.

In the organic light emitting diode display device of the present invention, a material of the first organic layer includes Acrylate, hexamethyldisiloxane (HMDSO), polyacrylates, polycarbonates and polystyrene.

In the organic light emitting diode display device of the present invention, the first inorganic layer covers the display region, and an outer boundary of the first inorganic layer exceeds the barrier.

In the organic light emitting diode display device of the present invention, the second inorganic layer covers the display region, and an outer boundary of the second inorganic layer exceeds the barrier.

In the organic light emitting diode display device of the present invention, a thickness range of the flexible substrate is from 5 μm to 30 μm.

In the organic light emitting diode display device of the present invention, by disposing the groove on the flexible substrate between the display region and the barrier, the thickness of the organic layer near the barrier is increased to improve the ability of the organic layer to cover the particle and to improve the encapsulation effect.

DESCRIPTION OF SPECIFIC EMBODIMENTS OF THE INVENTION

Figure 1:
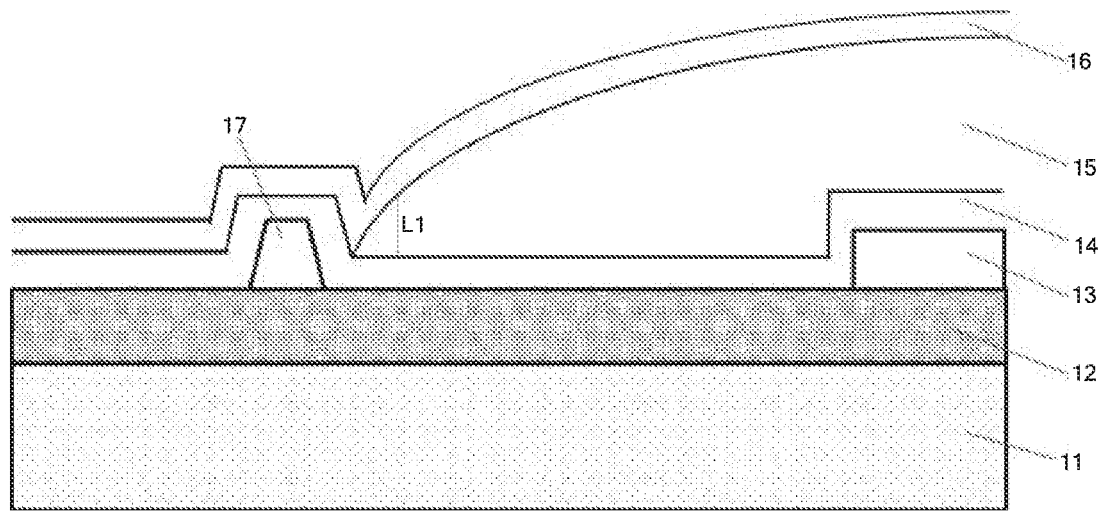
FIG. 1 is a structural diagram of an organic light emitting diode display device according to the prior art.

The following descriptions for the respective embodiments are specific embodiments capable of being implemented for illustrations of the present invention with referring to appended figures. The terms of up, down, front, rear, left, right, interior, exterior, side, etcetera mentioned in the present invention are merely directions of referring to appended figures. Thus, the used directional terms are used to describe and understand the present invention, but the present invention is not limited thereto. In the figure, units with similar structures are denoted by the same reference numerals.

As shown in FIG. 1, the organic light emitting diode display device of the prior art includes a flexible substrate 11 and a switching array layer 12. The switching array layer 12 is positioned on the flexible substrate 11. The flexible substrate 11 includes a display area. The flexible substrate 11 of the display area is provided with an organic light emitting diode unit 13. A thin film packaging layer covers the organic light emitting diode unit 13. The thin film packaging layer includes a first inorganic layer 14, a first organic layer 15 and a second inorganic layer 16. A barrier 17 is disposed outside the display area. The thickness of the first organic layer 15 near the barrier 17 is L1.

Figure 2:
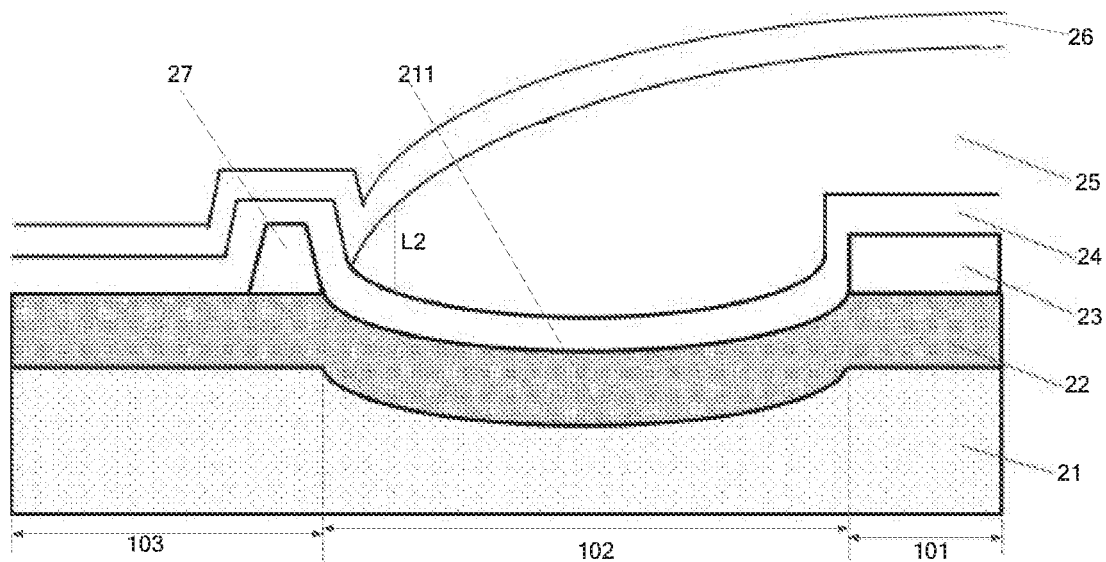
FIG. 2 is a first structural diagram of an organic light emitting diode display device of the present invention.

Please refer to FIGS. 2 to 6. FIG. 2 is a structural diagram of an organic light emitting diode display device of the present invention.

As shown in FIG. 2, the organic light emitting diode display device of the present invention includes a flexible substrate 21. The flexible substrate 21 includes a display region 101, a first barrier region 102 and a second barrier region 103. The first barrier region 102 is located between the display region 101 and the second barrier region 103, and a barrier 27 is disposed on the flexible substrate 21 of the second barrier region 103; wherein a groove 211 is formed in the flexible substrate 21 of the first barrier region 102, and the opening of the groove 211 is upward. An organic light emitting diode unit 23 is disposed on the flexible substrate 21 of the display region 101.

In one embodiment, a cross-sectional shape of the groove 211 is curved.

Figure 3:
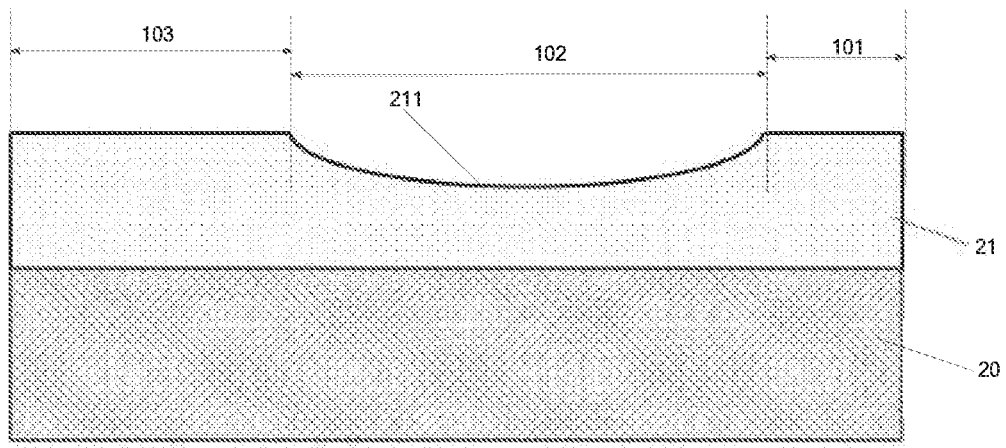
FIG. 3 is a structural diagram showing the first step and the second step of a manufacturing method of the organic light emitting diode display device in FIG. 2.

With FIG. 3, a depth range of the groove 211 is from 1 μm to 10 μm. Since the depth of the groove is within the range, the thickness of the organic layer near the barrier can be better improved to further improve covering ability of the particle (organic light emitting diode unit).

Figure 4:
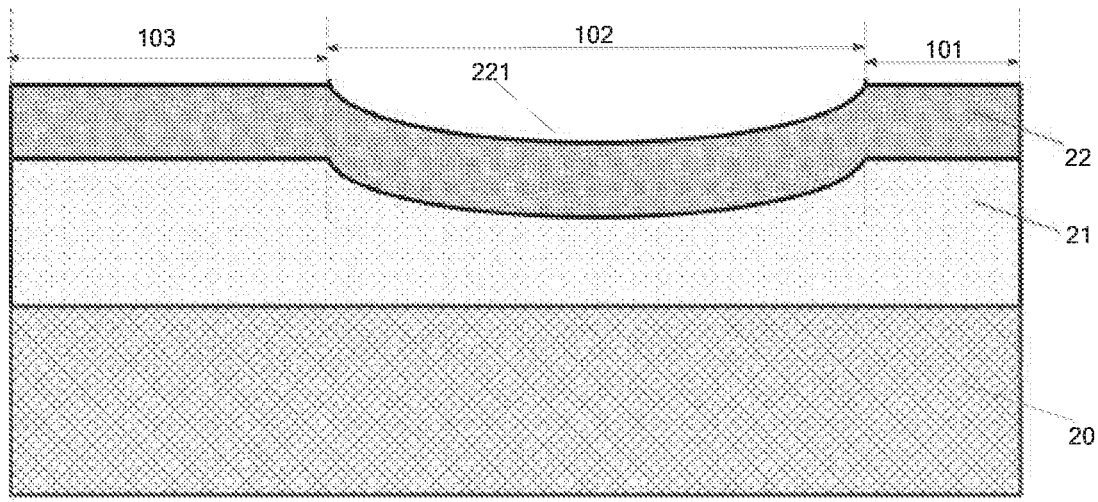
FIG. 4 is a structural diagram showing the third step of a manufacturing method of the organic light emitting diode display device in FIG. 2.

As shown in FIG. 4, the organic light emitting diode display device includes a switching array layer 22. The switching array layer 22 is located on the entire flexible substrate 21. The switching array layer 22 corresponding to the first barrier region 102 also possesses a groove 221.

As shown in FIG. 2, the organic light emitting diode display device further includes: a thin film encapsulation layer. The thin film encapsulation layer is disposed on the organic light emitting diode unit 23 and the barrier 27. The thin film encapsulation layer includes a stacked structure of a first inorganic layer 24, a first organic layer 25 and a second inorganic layer 26. A thickness L2 of the first organic layer 25 near the barrier 27 is greater than a predetermined value. The predetermined value can be set as needed. When the thickness of the first organic layer 25 near the barrier 27 is greater than the predetermined value, the particle covering ability can be improved. As comparing FIG. 2 with FIG. 1, it can be easily understood that the thickness of the first organic layer near the barrier 27 increases, that is, L2 is greater than L1.

The first organic layer 25 covers the display region 101 and the first barrier region 102, and the first organic layer is located inside the barrier 27.

In order to facilitate the formation of the groove having a predetermined depth without increasing the thickness of the display device, a thickness range of the flexible substrate 21 is from 5 μm to 30 μm.

The manufacturing method of the organic light emitting diode display device of the present invention comprises:

Step S101, forming a flexible substrate 21 on a glass substrate 20, first.

For instance, as shown in FIG. 3, the flexible substrate 21 includes a display region 101, a first barrier region 102 and a second barrier region 103.

Step S102, forming a groove in the flexible substrate 21 by etching or imprinting.

For instance, as shown in FIG. 3, a groove is formed in the first barrier region 102 of the flexible substrate 21 with a mold by imprinting. Alternatively, a groove 211 is etched by photoresist coating, exposure, development and etching according to the prior art.

A depth range of the groove 211 is from 1 μm to 10 μm, and a cross-sectional shape of the groove is curved.

Step S103, fabricating a switching array layer 22 on the flexible substrate 21.

For instance, as shown in FIG. 4, the switching array layer 22 includes a plurality of switching elements, and the switching array layer 22 may include a gate, a channel, a source and a drain, and may further include a planarization layer. A buffer layer is further disposed between the flexible substrate 21 and the switching array layer 22.

Step S104, fabricating an organic light emitting diode unit and a barrier on the switching array layer 22, separately.

Figure 5:
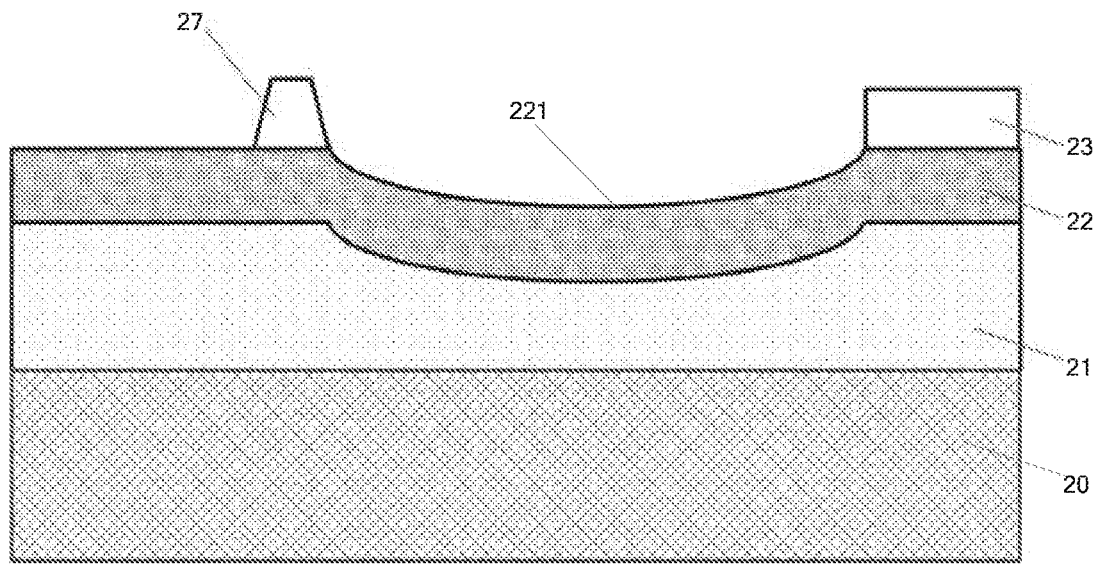
FIG. 5 is a structural diagram showing the fourth step of a manufacturing method of the organic light emitting diode display device in FIG. 2.

For instance, as shown in FIG. 5, an organic light emitting diode unit 23 and a barrier 27 are fabricated on the switching array layer 22.

The specific manufacturing process of the organic light emitting diode unit 23 is as follows: an anode, a pixel definition layer, and the like are formed on the switching array layer 22, and then an organic light emitting display layer and a cathode are deposited on the switching array layer 22. The organic light emitting layer includes a hole injection/transport layer, a light emitting layer and an electron transport/injection layer.

The barrier 27 can also be fabricated with the planarization layer or the pixel definition layer at the same time.

Step S105, fabricating a thin film encapsulation layer on the organic light emitting diode unit.

For instance, as shown in FIG. 2, After the organic light emitting diode unit 23 and the barrier 27 are fabricated, the first inorganic layer 24 is deposited on the organic light emitting diode unit 23 by one of processes of ALD, PLD, Sputter and PECVD. The first organic layer 25 is deposited on the first inorganic layer 24 by means of IJP, PECVD or slot coating. The second inorganic layer 26 is deposited on the first organic layer 25 by ALD, PLD, Sputter or PECVD.

A material of the first inorganic layer 24 includes SiNx, SiOxNy, SiOx, SiCxNy, ZnO and AlO. The first inorganic layer 24 covers the display region 101, and an outer boundary of the first inorganic layer exceeds the barrier 27.

A material of the first organic layer 25 includes Acrylate, hexamethyldisiloxane (HMDSO), polyacrylates, polycarbonates and polystyrene. The first inorganic layer 25 covers the display region 101, and an outer boundary of the first inorganic layer does not exceed the barrier 27.

A material of the second inorganic layer 26 includes SiNx, SiOxNy, SiOx, SiCxNy, ZnO and AlOx. The second inorganic layer 26 covers the display region 101, and an outer boundary of the second inorganic layer exceeds the barrier 27.

Figure 6:
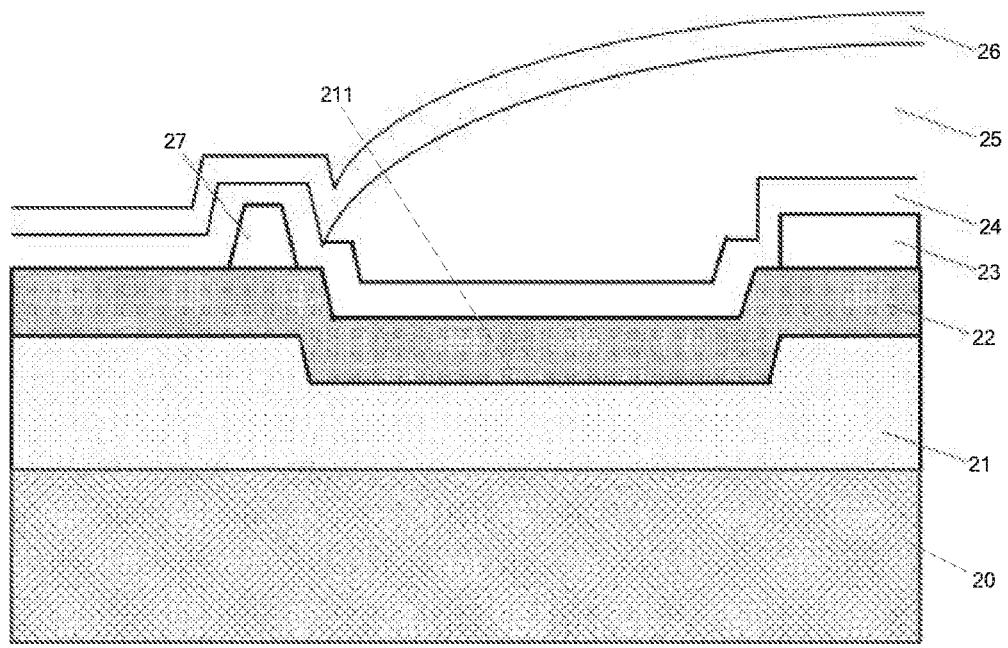
FIG. 6 is a second structural diagram of an organic light emitting diode display device of the present invention.

In another embodiment, as shown in FIG. 6, a cross-sectional shape of the groove 211 is trapezoidal. Certainly, the cross-sectional shape of the groove 211 is not limited to the aforesaid shapes, and may be other shapes.

In the organic light emitting diode display device of the present invention, by disposing the groove on the flexible substrate between the display region and the barrier, the thickness of the organic layer near the barrier is increased to improve the ability of the organic layer to cover the particle and to improve the encapsulation effect.

In summary, although the above preferred embodiments of the present invention are disclosed, the foregoing preferred embodiments are not intended to limit the invention, those skilled in the art can make various kinds of alterations and modifications without departing from the spirit and scope of the present invention. Thus, the scope of protection of the present invention is defined by the scope of the claims.

What is claimed is:

1. An organic light emitting diode display device, including:
   a flexible substrate including a display region, a first barrier region and a second barrier region, wherein the first barrier region is located between the display region and the second barrier region, and a barrier is disposed on the flexible substrate of the second barrier region; wherein a groove is formed in the flexible substrate of the first barrier region, and an organic light emitting diode unit is disposed on the flexible substrate of the display region, and a depth range of the groove is from 1 μm to 10 μm, and a thin film encapsulation layer is disposed on the organic light emitting diode unit and the barrier, and the thin film encapsulation layer includes a stacked structure of a first inorganic layer, a first organic layer and a second inorganic layer.

2. The organic light emitting diode display device according to claim 1, wherein the groove is formed by etching or imprinting.

3. The organic light emitting diode display device according to claim 1, wherein the organic light emitting diode display device further includes:
   a switching array layer, located on the entire flexible substrate, wherein the switching array layer corresponding to the first barrier region also possesses a groove.

4. The organic light emitting diode display device according to claim 1, wherein
   a cross-sectional shape of the groove is curved or trapezoidal.

5. The organic light emitting diode display device according to claim 1, wherein the organic light emitting diode display device further includes:
   the first organic layer covers the display region and the first barrier region, and the first organic layer is located inside the barrier.

6. The organic light emitting diode display device according to claim 1, wherein a material of the first inorganic layer includes SiNx, SiOxNy, SiOx, SiCxNy, ZnO and AlO.

7. The organic light emitting diode display device according to claim 1, wherein a material of the first organic layer includes Acrylate, hexamethyldisiloxane (HMDSO), polyacrylates, polycarbonates and polystyrene.

8. The organic light emitting diode display device according to claim 1, wherein a thickness range of the flexible substrate is from 5 μm to 30 μm.

9. An organic light emitting diode display device, including:
   a flexible substrate including a display region, a first barrier region and a second barrier region, wherein the first barrier region is located between the display region and the second barrier region, and a barrier is disposed on the flexible substrate of the second barrier region; wherein a groove is formed in the flexible substrate of the first barrier region, and an organic light emitting diode unit is disposed on the flexible substrate of the display region, a depth range of the groove is from 1 μm to 10 μm.

10. The organic light emitting diode display device according to claim 9, wherein the groove is formed by etching or imprinting.

11. The organic light emitting diode display device according to claim 9, wherein the organic light emitting diode display device further includes:
a switching array layer, located on the entire flexible substrate, wherein the switching array layer corresponding to the first barrier region also possesses a groove.

12. The organic light emitting diode display device according to claim 9, wherein
a cross-sectional shape of the groove is curved or trapezoidal.

13. The organic light emitting diode display device according to claim 9, wherein the organic light emitting diode display device further includes:
a thin film encapsulation layer, disposed on the organic light emitting diode unit and the barrier, wherein the thin film encapsulation layer includes a stacked structure of a first inorganic layer, a first organic layer and a second inorganic layer.

14. The organic light emitting diode display device according to claim 13, wherein the first organic layer covers the display region and the first barrier region, and the first organic layer is located inside the barrier.

15. The organic light emitting diode display device according to claim 13, wherein a material of the first inorganic layer includes SiNx, SiOxNy, SiOx, SiCxNy, ZnO and AlO.

16. The organic light emitting diode display device according to claim 13, wherein a material of the first organic layer includes Acrylate, hexamethyldisiloxane (HMDSO), polyacrylates, polycarbonates and polystyrene.

17. The organic light emitting diode display device according to claim 13, wherein the first inorganic layer covers the display region, and an outer boundary of the first inorganic layer exceeds the barrier.

18. The organic light emitting diode display device according to claim 13, wherein the second inorganic layer covers the display region, and an outer boundary of the second inorganic layer exceeds the barrier.

19. The organic light emitting diode display device according to claim 9, wherein a thickness range of the flexible substrate is from 5 μm to 30 μm.

* * * * *